United States Patent
Tolle et al.

(10) Patent No.: US 9,299,557 B2
(45) Date of Patent: Mar. 29, 2016

(54) PLASMA PRE-CLEAN MODULE AND PROCESS

(71) Applicant: ASM IP HOLDING B.V., Almere (NL)

(72) Inventors: John Tolle, Gilbert, AZ (US); Matthew G. Goodman, Chandler, AZ (US); Robert Michael Vyne, Gilbert, AZ (US); Eric R. Hill, Goodyear, AZ (US)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 14/220,001

(22) Filed: Mar. 19, 2014

(65) Prior Publication Data

US 2015/0270122 A1    Sep. 24, 2015

(51) Int. Cl.
*H01L 21/02* (2006.01)
*H01L 21/3205* (2006.01)
*H01L 21/324* (2006.01)
*H01L 21/311* (2006.01)

(52) U.S. Cl.
CPC ...... *H01L 21/02068* (2013.01); *H01L 21/0217* (2013.01); *H01L 21/02046* (2013.01); *H01L 21/02301* (2013.01); *H01L 21/02348* (2013.01); *H01L 21/02661* (2013.01); *H01L 21/31116* (2013.01); *H01L 21/324* (2013.01); *H01L 21/3205* (2013.01)

(58) Field of Classification Search
CPC ............... H01L 21/02068; H01L 21/3205; H01L 21/02348; H01L 21/324; H01L 21/0217; H01L 2924/0002; H01L 2924/00; H01L 21/02532; H01L 21/0262; H01L 21/02164; H01L 21/31612; H01L 21/02057; H01L 21/76814; H01L 21/02271; H01L 21/02381
USPC ......................................................... 438/607
See application file for complete search history.

(56) References Cited

U.S. PATENT DOCUMENTS

| 4,361,461 | A | 11/1982 | Chang |
| 4,517,223 | A | 5/1985 | Ovshinsky et al. |
| 4,615,905 | A | 10/1986 | Ovshinsky et al. |
| 4,632,057 | A | 12/1986 | Price et al. |
| 4,699,689 | A | 10/1987 | Bersin |

(Continued)

FOREIGN PATENT DOCUMENTS

JP    02-256235    10/1990

OTHER PUBLICATIONS

Nishino, H., Hayasaka, N., and Okano, H., "Damagefree selective etching of Si native oxides using NH3/NF3 and SF6/H2O down-flow etching," Journal of Applied Physics, Jun. 1993, vol. 74, Issue 2, p. 1345.

(Continued)

*Primary Examiner* — Caleen Sullivan
(74) *Attorney, Agent, or Firm* — Knobbe, Martens, Olson & Bear, LLP (57) ABSTRACT

A method for integrated circuit fabrication can include removing silicon oxide by a pre-clean process. The pre-clean process can include depositing a halogen-containing material on the surface of a substrate in a first reaction chamber, and transferring the substrate having the halogen-containing material to a second reaction chamber. Silicon oxide material can be removed from a surface of the substrate by sublimating the halogen-containing material in the second reaction chamber. A target material, such as a conductive material, may subsequently be deposited on the substrate surface in the second reaction chamber.

39 Claims, 5 Drawing Sheets

(56) References Cited

U.S. PATENT DOCUMENTS

| | | | |
|---|---|---|---|
| 4,820,377 | A | 4/1989 | Davis et al. |
| 4,904,621 | A | 2/1990 | Loewenstein et al. |
| 4,913,929 | A | 4/1990 | Moslehi et al. |
| 5,030,319 | A | 7/1991 | Nishino et al. |
| 5,138,973 | A | 8/1992 | Davis et al. |
| 5,198,634 | A | 3/1993 | Mattson et al. |
| 5,228,206 | A | 7/1993 | Grant et al. |
| 5,248,636 | A | 9/1993 | Davis et al. |
| 5,338,393 | A * | 8/1994 | Burmer .......... 438/676 |
| 5,403,434 | A | 4/1995 | Moslehi |
| 5,620,559 | A | 4/1997 | Kikuchi |
| 5,686,748 | A | 11/1997 | Thakur et al. |
| 5,698,039 | A | 12/1997 | Patz et al. |
| 5,923,966 | A | 7/1999 | Teramoto et al. |
| 5,939,831 | A | 8/1999 | Fong et al. |
| 5,992,429 | A | 11/1999 | Peckman |
| 6,008,128 | A | 12/1999 | Habuka et al. |
| 6,063,300 | A | 5/2000 | Suzuki et al. |
| 6,071,823 | A | 6/2000 | Hung et al. |
| 6,077,353 | A | 6/2000 | Al-Sharif et al. |
| 6,079,426 | A | 6/2000 | Subrahmanyam et al. |
| 6,107,192 | A | 8/2000 | Subrahmanyan et al. |
| 6,110,836 | A | 8/2000 | Cohen et al. |
| 6,153,529 | A | 11/2000 | Agarwal |
| 6,165,273 | A | 12/2000 | Fayfield et al. |
| 6,197,694 | B1 | 3/2001 | Beinglass |
| 6,313,042 | B1 | 11/2001 | Cohen et al. |
| 6,319,861 | B1 | 11/2001 | Shih et al. |
| 6,329,297 | B1 | 12/2001 | Balish et al. |
| 6,339,028 | B2 | 1/2002 | Tesauro |
| 6,346,489 | B1 | 2/2002 | Cohen et al. |
| 6,347,636 | B1 | 2/2002 | Xia et al. |
| 6,372,657 | B1 | 4/2002 | Hineman et al. |
| 6,374,831 | B1 | 4/2002 | Chandran et al. |
| 6,395,192 | B1 | 5/2002 | Nemirovsky et al. |
| 6,457,478 | B1 | 10/2002 | Danese |
| 6,498,107 | B1 | 12/2002 | Fenner |
| 6,534,412 | B1 | 3/2003 | Lin |
| 6,537,876 | B2 | 3/2003 | Chung et al. |
| 6,706,334 | B1 | 3/2004 | Kobayashi et al. |
| 6,767,834 | B2 | 7/2004 | Chung et al. |
| 6,776,874 | B2 | 8/2004 | Kobayashi et al. |
| 7,235,492 | B2 | 6/2007 | Samoilov |
| 7,396,480 | B2 | 7/2008 | Kao et al. |
| 7,416,989 | B1 | 8/2008 | Liu et al. |
| 7,494,545 | B2 | 2/2009 | Lam et al. |
| 7,604,708 | B2 | 10/2009 | Wood et al. |
| 7,651,948 | B2 | 1/2010 | Kim et al. |
| 7,704,887 | B2 | 4/2010 | Fu et al. |
| 7,767,024 | B2 | 8/2010 | Kao et al. |
| 7,780,793 | B2 | 8/2010 | Yang et al. |
| 8,043,972 | B1 | 10/2011 | Liu et al. |
| 8,187,486 | B1 | 5/2012 | Liu et al. |
| 8,445,352 | B2 | 5/2013 | Yokoyama et al. |
| 8,445,389 | B2 | 5/2013 | Zojaji et al. |
| 8,551,880 | B2 | 10/2013 | Mebarki et al. |
| 8,772,162 | B2 | 7/2014 | Zheng et al. |
| 8,951,913 | B2 | 2/2015 | Zheng et al. |
| 8,956,980 | B1 | 2/2015 | Chen et al. |
| 2001/0032704 | A1 | 10/2001 | Tesauro |
| 2002/0045355 | A1 | 4/2002 | Chong et al. |
| 2002/0106908 | A1 | 8/2002 | Cohen et al. |
| 2002/0108930 | A1 | 8/2002 | Nemirovsky et al. |
| 2002/0124867 | A1 | 9/2002 | Kim et al. |
| 2002/0151156 | A1 | 10/2002 | Hallock et al. |
| 2003/0060030 | A1 | 3/2003 | Lee et al. |
| 2006/0024970 | A1 | 2/2006 | Smith et al. |
| 2006/0196527 | A1 | 9/2006 | Nishimura et al. |
| 2010/0041212 | A1 | 2/2010 | Jinzu et al. |
| 2013/0309875 | A1 | 11/2013 | Huang et al. |
| 2014/0011339 | A1 | 1/2014 | Zheng et al. |
| 2014/0252565 | A1 | 9/2014 | Greer et al. |
| 2014/0273493 | A1 | 9/2014 | Limdulpaiboon et al. |

OTHER PUBLICATIONS

European Search Report dated Nov. 16, 2015 received in corresponding EP App. No. 15158948, filed Mar. 13, 2015, in 7 pages.
Office Action from co-pending U.S. Appl. No. 14/586,438 mailed Jan. 15, 2016, in 11 pages.

* cited by examiner

PLASMA PRE-CLEAN MODULE AND PROCESS

BACKGROUND

1. Field

The present invention relates to the fabrication of integrated circuits, particularly to methods and apparatuses for pre-cleaning a substrate surface.

2. Description of the Related Art

Fabrication of integrated circuits often can involve formation of one or more material layers on a substrate surface. These material layers can include, for example, mono-crystalline, polycrystalline, and/or amorphous material layers. Formation of the material layers can be achieved using various thin film deposition techniques, including various physical (e.g., physical sputtering) and/or chemical (e.g., chemical vapor deposition, atomic layer deposition, and/or epitaxial deposition) deposition techniques. For example, mono-crystalline material formation on a substrate surface can be performed using an epitaxial deposition process, such as for formation of mono-crystalline semiconductor materials (e.g., mono-crystalline silicon).

The presence of an intervening material (e.g., a native oxide layer, such as a silicon oxide material layer on a silicon substrate) on the substrate surface may interfere with formation of a desired material layer over that substrate surface. For example, the intervening material may cause introduction of an increased number of defects in the structure of the desired material layer and/or may adversely affect an electrical performance of the desired material layer. In some embodiments, an intervening material such as a native oxide material may form on a substrate surface due to exposure of the substrate to oxygen during the integrated circuit fabrication process (e.g., exposure to ambient air during transfer of the substrate between fabrication systems, and/or to residual oxidizing agents within fabrication systems).

Accordingly, there is a continuing need for processes for forming high quality layers on a substrate surface.

SUMMARY

A method for integrated circuit fabrication can include removing a silicon oxide material from a surface of a substrate. In some embodiments, removing the silicon oxide material can include depositing a halogen-containing material on the surface of the substrate in a first reaction chamber, and transferring the substrate having the halogen-containing material to a second reaction chamber. The halogen-containing material can be sublimated in the second reaction chamber. Subsequently, a conductive material is deposited on the substrate surface in the second reaction chamber.

In some embodiments, sublimating the halogen-containing material can include heating the surface of the substrate to a temperature of about 80° C. or greater. In some embodiments, sublimating the halogen-containing material can include heating the surface of the substrate to a temperature of about 80° C. to about 100° C.

In some embodiments, the surface of the substrate further includes silicon nitride, and removing the silicon oxide material can include selectively removing the silicon oxide material relative to the silicon nitride at a selectivity of about 7:1 to about 60:1.

In some embodiments, depositing the halogen-containing material can include introducing into the first reaction chamber a carrier gas activated by a remote plasma unit, and a halogen-containing gas. The carrier gas may include an inert gas, including for example argon.

In some embodiments, the method can include activating the halogen-containing gas by flowing the halogen-containing gas through the remote plasma unit.

In some embodiments, depositing the halogen-containing material further can include subsequently introducing into the first reaction chamber a halogen-containing gas unactivated by a plasma unit and a hydrogen-containing gas unactivated by a plasma unit. In some embodiments, the method can include removing the activated halogen-containing gas from the first reaction chamber prior to introducing into the first reaction chamber the unactivated halogen-containing gas and the unactivated hydrogen-containing gas.

In some embodiments, depositing the halogen-containing material can include subsequently introducing into the first reaction chamber a halogen-containing gas unactivated by a plasma unit followed by a hydrogen-containing gas unactivated by a plasma unit. In some embodiments, the method can include removing the activated halogen-containing gas from the first reaction chamber prior to introducing into the first reaction chamber the unactivated halogen-containing gas, and removing the unactivated halogen-containing gas from the first reaction chamber prior to introducing the unactivated hydrogen-containing gas.

In some embodiments, the halogen-containing gas can include a fluorine-containing gas. The fluorine-containing gas may include nitrogen trifluoride. In some embodiments, the halogen-containing gas can include at least one of hydrogen fluoride and diatomic fluorine.

In some embodiments, depositing the halogen-containing material can include introducing a hydrogen-containing gas into the first reaction chamber. In some embodiments, the method can include activating at least one of the hydrogen-containing gas and the halogen-containing gas by flowing at least one of the hydrogen-containing gas and the halogen-containing gas through the remote plasma unit. The hydrogen-containing gas may include ammonia.

In some embodiments, introducing the hydrogen-containing gas into the first reaction chamber can include flowing the hydrogen-containing gas through a transfer tube between a remote plasma unit and the first reaction chamber, and heating at least a portion of the transfer tube to a temperature of about 30° C. to about 120° C.

In some embodiments, the hydrogen-containing gas and the halogen-containing gas can be introduced into the first reaction chamber at a molar ratio of about 3:1 to about 10:1.

In some embodiments, the halogen-containing material can include ammonium hexafluorosilicate (($NH_4)_2SiF_6$).

In some embodiments, sublimating the halogen-containing material can include exposing the halogen-containing material to a plasma generated by a remote plasma unit. Sublimating the halogen-containing material may include exposing the halogen-containing material to a heated gas, where the heated gas is heated to a temperature of greater than about 150° C. In some embodiments, sublimating the halogen-containing material can include exposing the halogen-containing material to ultra-violet radiation.

In some embodiments, the substrate can be maintained at a temperature of about 21° C. to about 28° C. during depositing the halogen-containing material.

In some embodiments, the second reaction chamber can include an epitaxial deposition chamber and depositing the conductive material can include performing an epitaxial deposition of silicon.

In some other embodiments, a method for integrated circuit fabrication can include removing a silicon oxide material from a surface of a substrate. Removing the silicon oxide material can include depositing a first halogen-containing material on the surface of the substrate in a first reaction chamber, and sublimating the first halogen-containing material in the first reaction chamber. A second halogen-containing material is deposited on the surface of the substrate in the first reaction chamber and can be subsequently sublimated.

In some embodiments, the method can include transferring the substrate having the second halogen-containing material into a second reaction chamber. In some embodiments, sublimating the second halogen-containing material can be performed in the second reaction chamber.

In some embodiments, the method can include depositing a conductive material on the substrate surface in the second reaction chamber. Depositing the conductive material can include performing an epitaxial deposition of silicon.

In some embodiments, the surface of the substrate further can include silicon nitride, and removing the first silicon oxide material can include selectively removing the first silicon oxide material relative to the silicon nitride with a selectivity of about 7:1 to about 20:1.

In some embodiments, removing the second silicon oxide material can include selectively removing the second silicon oxide material relative to the silicon nitride with a selectivity of about 10:1 to about 100:1. In some embodiments, removing the second silicon oxide material can include selectively removing the second silicon oxide material relative to the silicon nitride with a selectivity of about 40:1 to about 100:1.

In some embodiments, at least one of depositing the first halogen-containing material and depositing the second halogen-containing material can include introducing a carrier gas into the first reaction chamber. In some embodiments, the method can include activating the carrier gas by flowing the carrier gas through a remote plasma unit.

In some embodiments, depositing the first halogen-containing material and depositing the second halogen-containing material can include introducing into the first reaction chamber a halogen-containing gas and a hydrogen-containing gas. At least one of the halogen-containing gas and the hydrogen-containing gas may be activated by flowing at least one of the halogen-containing gas and the hydrogen-containing gas through the remote plasma unit.

In some embodiments, the halogen-containing gas can include at least one of nitrogen trifluoride, hydrogen fluoride, and diatomic fluorine, where the hydrogen-containing gas can include ammonia, and wherein the carrier gas can include argon.

In some embodiments, at least one of the first halogen-containing material and the second halogen-containing material can include ammonium hexafluorosilicate (($NH4)_2SiF_6$). In some embodiments, the first halogen-containing material and the second halogen-containing material can include the same material.

BRIEF DESCRIPTION OF THE DRAWINGS

Various features, aspects, and advantages of the present disclosure are described with reference to the drawings of certain embodiments, which are intended to illustrate certain embodiments and not to limit the invention.

DETAILED DESCRIPTION

Various embodiments are described herein in relation to a pre-cleaning process for removing a silicon oxide material from an exposed surface of a substrate. It will be understood that the resulting pre-cleaned surface can provide a surface that facilitates the later formation of high quality layers of materials, such as the epitaxial growth of silicon.

In some embodiments, a process for integrated circuit fabrication can include pre-cleaning a substrate surface to remove an undesired material. The undesired material may comprise an oxide material (e.g., a native silicon oxide material formed on a silicon substrate) in some embodiments. Deposition of a pre-clean material and subsequent volatilization of the pre-clean material can advantageously cause removal of the oxide material from the substrate surface.

Without being limited by theory, it is believed that, to form the pre-clean material, reactant species flowed into the reaction chamber during the pre-clean process may chemically interact with the undesired material on the substrate surface. In some embodiments, the pre-clean material may comprise one or more components generated from chemical reactions between the reactant species and a substrate surface oxide material and/or chemical reactions between the reactant species themselves. For example, a pre-clean process may use a reactant gas comprising a halogen such that the halogen-containing reactant gas chemically reacts with the substrate surface silicon oxide to form a pre-clean material comprising halogen and silicon.

In some embodiments, the pre-clean material can be formed in a reaction chamber different from that in which the pre-clean material is subsequently removed from the surface of the substrate. In some embodiments, the pre-clean material can be formed in a first reaction chamber and subsequently transferred to a second reaction chamber where the pre-clean material is removed to provide a pre-cleaned substrate surface. In some embodiments, the removal is accomplished by volatizing the pre-clean material, such as by sublimating the material. The second reaction chamber may be a chamber in which a target material can be formed on the pre-cleaned substrate surface, including for example deposition of a conductive material. The conductive material can include, without limitation, a semiconductor-containing material (e.g., a silicon-containing material), a metal-containing material, or combinations thereof. As used herein, a target material is a material deposited directly in contact with the pre-cleaned substrate surface. In addition, removing the pre-clean material can include removing part or all of the pre-clean material from the substrate. In some embodiments, the substrate, from which the oxide material is removed, may be patterned (e.g., have a pattern of recesses such as trenches on its surface). In some embodiments, the substrate may include exposed electronic devices (e.g., transistor structures).

In some embodiments, the second reaction chamber can be an epitaxial deposition chamber and the target material can be mono-crystalline silicon. For example, the pre-clean material can be removed from the substrate surface by sublimation in the second reaction chamber to provide a pre-cleaned substrate surface, and epitaxial growth of silicon can be subsequently performed on the pre-cleaned substrate surface in the second reaction chamber to form a mono-crystalline silicon layer on the substrate.

Removal of the pre-clean material in the same reaction chamber in which a target material is subsequently formed on the substrate may advantageously provide a high quality surface for the later deposition of the target material. For example, the pre-clean material may provide a protective layer over the substrate surface, reducing and/or preventing or substantially preventing additional oxidation from occurring on the substrate surface during transport of the substrate to the reaction chamber for the target material deposition. In some embodiments, removal of the pre-clean material in the same reaction chamber in which the target material is subsequently formed may facilitate deposition of a target material having a reduced defect count and/or improved electrical performance. In some embodiments, removal of the pre-clean material in the same reaction chamber in which the target material is subsequently formed may facilitate transport of the substrate outside of a vacuum environment subsequent to the pre-clean process, and/or use of reaction chambers not vacuum coupled to one another (e.g., use of reaction chambers not coupled to one another through various gating valves, such as reaction chambers in a cluster tool).

In some embodiments, a pre-clean process can include a plurality of cycles, where each cycle can include forming a pre-clean material and removing the pre-clean material. A pre-clean process including more than one cycle may advantageously demonstrate exceptionally high selectivity. For example, as compared to selectivity performance of a first cycle of the pre-clean process, a second cycle and/or other subsequent cycles of the pre-clean process can demonstrate significantly higher selective removal of silicon oxide from the substrate surface relative to removal of another material, such as silicon nitride, from the substrate surface.

Figure 1:
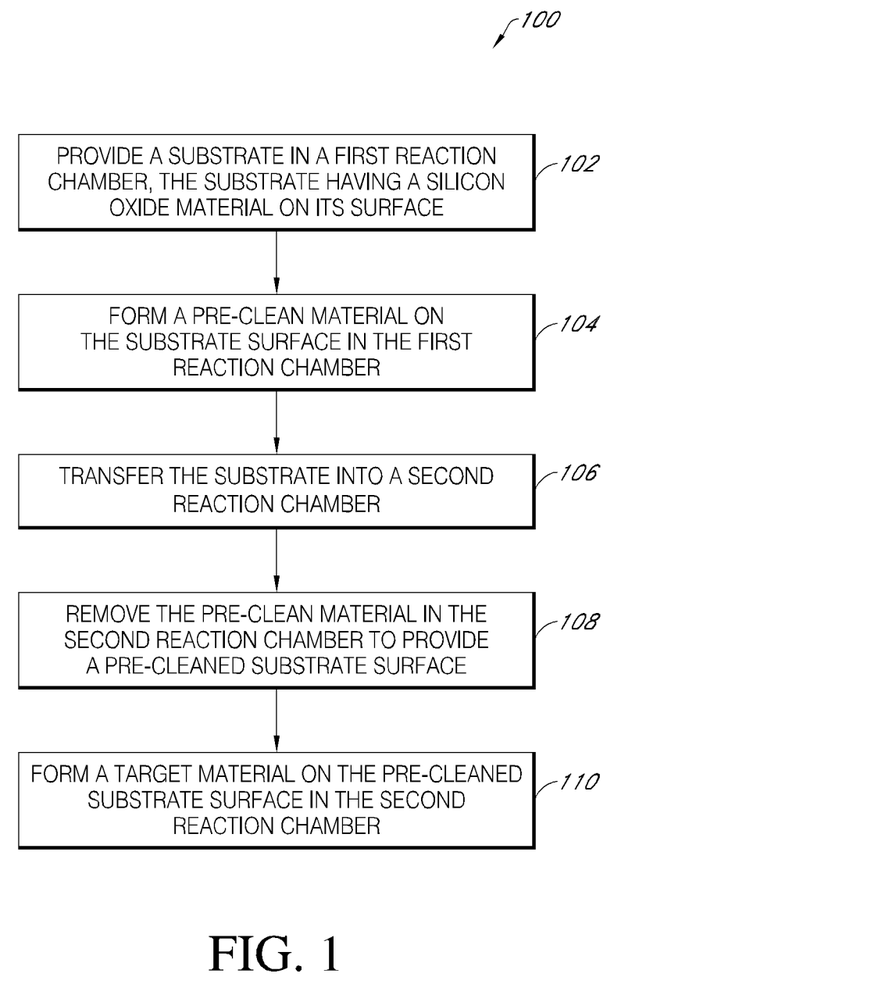
FIG. 1 shows an example of a process for pre-cleaning a substrate surface and for forming a target material on the substrate surface.

Referring to FIG. 1 an example process 100 for pre-cleaning a substrate surface and subsequently forming a target material on the pre-cleaned substrate surface is shown. In block 102, a substrate having a silicon oxide material on its surface is provided in a first reaction chamber. In block 104, pre-clean material, such as a material containing a halogen, can be formed on the substrate surface in the first reaction chamber. In some embodiments, the halogen-containing material can be formed by exposing silicon oxide on the substrate surface to a reactant gas of the pre-clean process. For example, the halogen-containing material may comprise one or more products resulting from the interaction between the reactant gas and the silicon oxide. In block 106, the substrate may next be transferred to a second reaction chamber. In block 108, the pre-clean material can be removed in the second reaction chamber to provide a substrate having a pre-cleaned surface. For example, the pre-clean material, such as a halogen-containing material, may be sublimated in the second reaction chamber (e.g., by heating the substrate to or above a sublimation temperature of one or more components of the pre-clean material). Sublimation of the pre-clean material may facilitate removal of the silicon oxide on the substrate surface. In block 110, a target material can be subsequently formed on the pre-cleaned substrate surface in the second reaction chamber. In some embodiments, the target material can be an epitaxial layer, such as an epitaxial silicon layer.

In some embodiments, a substrate surface may comprise a silicon nitride material (e.g., a silicon nitride material used in formation of various electronic devices on the substrate surface, including spacer features for the electronic devices) and a silicon oxide material which is to be removed by the pre-clean process. In some embodiments, a silicon oxide material on a substrate surface can be selectively removed relative to a silicon nitride material on the substrate surface at a selectivity of greater than about 7:1. In some embodiments, the selectivity of a pre-clean process for removing silicon oxide relative to silicon nitride can be about 6:1 to about 150:1. For example, the selectivity can be about 6:1 to about 60:1, or about 7:1 to about 15:1, including about 8:1 to about 15:1 or about 8:1 to about 12:1.

In some embodiments, the substrate can be maintained at a desired temperature during formation of the pre-clean material, including for example while the substrate surface is exposed to a reactant gas of the pre-clean process. In some embodiments, the substrate may be maintained at a temperature above a condensation temperature of the reactant gas during formation of the pre-clean material. For example, the substrate can be maintained at a temperature of greater than about 15° C., or greater than about 20° C. in some embodiments. In some embodiments, the substrate can be maintained at a temperature of about 15° C. to about 50° C., including about 15° C. to about 30° C., about 25° C. to about 30° C. For example, the substrate can be maintained at a temperature of about 22° C. to about 28° C., which can facilitate a high selectivity for the removal of silicon oxide relative to silicon nitride material on substrate surface.

The composition of the reactant gas of the pre-clean process can include one or more carrier gases. A suitable carrier gas can include any number of inert gases. In some embodiments, the carrier gas can comprise argon (Ar). In some embodiments, the reactant gas can also include a halogen-containing gas. For example, the halogen-containing gas can be a fluorine-containing gas. Suitable fluorine-containing gases can include without limitation, nitrogen trifluoride ($NF_3$), hydrogen fluoride (HF), and/or diatomic fluorine ($F_2$). In some embodiments, the reactant gas can also include a hydrogen-containing gas. A suitable hydrogen-containing gas can include, for example, ammonia ($NH_3$).

As described herein, the pre-clean material can comprise one or more components formed by reaction of the reactant gas and a substrate surface silicon oxide. For example, a reactant gas comprising ammonia, and one or more fluorine-containing compounds can chemically react with the silicon oxide to generate water vapor, and a pre-clean material comprising nitrogen, hydrogen, and silicon. In some embodiments, ammonia and nitrogen trifluoride, hydrogen fluoride, and/or fluorine can react with silicon oxide to provide a pre-clean material comprising ammonium hexafluorosilicate (($NH_4)_2SiF_6$). In some embodiments, the pre-clean material can comprise for example ammonium fluoride ($NH_4F$) and/or ammonium hydrogen fluoride ($NH_4HF_2$).

Without being limited by any particular theory or mode of operation, it is believed that ammonium fluoride ($NH_4F$) may be formed when a fluorine (F) atom from a halogen-containing constituent of the reactant gas (e.g., $NF_3$, HF, and/or $F_2$) reacts with ammonia ($NH_3$) to form hydrogen fluoride (HF), which can combine with ammonia ($NH_3$) to form ammonium fluoride ($NH_4F$). In some embodiments, ammonium fluoride can remove silicon oxide by decomposing and reacting with silicon oxide to form silicon tetrafluoride ($SiF_4$) and water vapor ($H_2O$), and the tetrafluoride ($SiF_4$) can combine with $NH_4F$ to form ammonium hexafluorosilicate (($NH_4)_2SiF_6$), the ammonium hexafluorosilicate (($NH_4)_2SiF_6$) forming a film layer on the substrate surface. For example, the electronegative fluorine (F) of ammonium fluoride can be attracted to the relatively more electropositive silicon (Si) of the silicon oxide, while ammonium ($NH_4^+$) can be attracted to oxygen (O) of the silicon oxide. In some embodiments, a pre-clean material comprising ammonium hexafluorosilicate (($NH_4$)$_2$$SiF_6$) can be decomposed and/or volatilized by heating the substrate, for example decomposing to form tetrafluoride ($SiF_4$), ammonia ($NH_3$) and/or hydrogen fluoride (HF).

The pre-clean material may be removed (e.g., decomposed and/or volatilized) using various techniques. In some embodiments, the pre-clean material can be removed through heating of the substrate to a temperature near, at, or above a sublimation temperature of components of the pre-clean material. For example, the substrate can be heated to a temperature of about 80° C. to about 500° C., including about 80° C. to about 100° C., under conditions that facilitate sublimation of the pre-clean material. For example, the substrate can be heated to a temperature of about 100° C. to cause sublimation of the ammonium hexafluorosilicate (($NH_4$)$_2$$SiF_6$)).

Other approaches for providing energy to the pre-clean material to cause removal of that material are also contemplated. In some embodiments, the pre-clean material can be exposed to gas species activated by a remote plasma source. In some embodiments, the species activated by the remote plasma source can interact with one or more components of the pre-clean material to form volatile species which can, for example, be removed from the substrate surface. In some embodiments, the gas species can be an inert gas species (e.g., Ar, $N_2$, He, etc.).

In some embodiments, a pre-clean material can be exposed to heated gas (e.g., heated inert gas) to facilitate removal of the pre-clean material. The gas can be heated to a temperature sufficient to heat the pre-clean material to a temperature that causes at least part of the pre-clean material to enter the vapor phase. For example, the temperature may be greater than about 80° C., about 100° C., about 120° C., or about 150° C.

In some embodiments, a pre-clean material can be exposed to ultra-violet (UV) and/or infrared (IR) radiation to facilitate removal of the pre-clean material. For example, the UV and/or IR radiation can provide energy that causes at least part of the pre-clean material to enter the vapor phase.

In some embodiments, exposing the pre-clean material to gas species activated by a remote plasma source, heated reactant gas, and/or ultra-violet radiation, can reduce the moisture content of the reaction chamber. Advantageously, the reduced moisture content can promote the sublimation of pre-clean material, since the sublimation can generate $H_2O$.

In some embodiments, removal of the pre-clean material can be performed during transfer of the substrate from a first reaction chamber (e.g., a reaction chamber in which the pre-clean material is formed) to a second different reaction chamber (e.g., a reaction chamber in which subsequent processing is performed, such as formation of a target material on the substrate). For example, a pre-clean material may be exposed to ultra-violet radiation and/or infrared radiation while being transferred from the first reaction chamber to the second reaction chamber.

One or more constituents of the pre-clean process reactant gas may be activated by a plasma source. For example, one or more constituents of the reactant gas may be activated by a remote plasma source (e.g., a remote plasma unit, or RPU), such as by flowing the one or more constituents through the remote plasma source to generate one or more activated reactant species (e.g., generate charged ions, and/or neutral atoms and/or radicals). In some embodiments, at least one of the constituents of the reactant gas is not activated by a plasma source.

In some embodiments, a substrate surface pre-clean process can include a carrier gas (e.g., argon), halogen-containing gas, and/or hydrogen-containing gas (e.g., to provide reactant species comprising argon-containing, halogen-containing, and/or hydrogen-containing charged ions, atoms, and/or radicals), at least one of which is plasma-activated. For example, a reactant gas comprising argon (Ar) may be activated by a remote plasma source, such as by flowing the argon gas through a remote plasma unit. In some embodiments, a fluorine-containing gas can be activated by being flowed through the remote plasma unit prior to being introduced into a reaction chamber. In some embodiments, the hydrogen-containing gas (e.g., ammonia) can be activated by flowing the hydrogen-containing gas through a remote plasma unit.

In some embodiments, one or more of the carrier gas, halogen-containing gas, and hydrogen-containing gas may not be plasma-activated. For example, unactivated reactant gas may not flow through a remote plasma source before the substrate surface is exposed to it in the reaction chamber. In some embodiments, the carrier gas can be activated by a remote plasma source while the halogen-containing gas and the hydrogen-containing gas may not be activated by a remote plasma source. For example, a fluorine containing gas and a hydrogen containing gas can be introduced into the reaction chamber without flowing the gases through a plasma source. In some embodiments, all constituents of the reactant gases are activated by a remote plasma source, including for example the carrier gas, the halogen-containing gas, and the hydrogen-containing gas.

In some embodiments, unactivated reactant gas can be combined with one or more reactant gases activated by a plasma source before being introduced into the reaction chamber. For example, unactivated reactant gas can be combined with reactant gas activated by a remote plasma source downstream of the remote plasma source prior to being introduced into the reaction chamber. In some embodiments, constituents of a reactant gas can be sequentially introduced into the reaction chamber. For example, the substrate may be first exposed to one or more activated constituents of the reactant gas, followed by one or more unactivated components of the reactant gas, or vice versa. In some embodiments, activated constituents and/or unactivated constituents of the reactant gas may themselves be sequentially introduced into the reaction chamber (e.g., a first activated constituent of the reactant gas, followed by a second activated constituent of the reactant gas).

In some embodiments, a carrier gas (e.g., argon) activated by a remote plasma source can be combined with an unactivated halogen-containing gas (e.g., hydrogen fluoride, diatomic fluorine, and/or nitrogen trifluoride) and unactivated hydrogen-containing gas (e.g., ammonia) at a location downstream of the remote plasma source, before the activated carrier gas and unactivated halogen-containing gas and unactivated hydrogen-containing gas are introduced into a reaction chamber. In some embodiments, a carrier gas (e.g., argon) and a halogen-containing gas (e.g., hydrogen fluoride, diatomic fluorine, and/or nitrogen trifluoride) are combined and activated by a remote plasma source, then combined with an unactivated hydrogen-containing gas (e.g., ammonia) at a location downstream of the remote plasma source before the activated carrier gas, the activated halogen-containing gas and the unactivated hydrogen-containing gas are introduced into a reaction chamber. In some embodiments, a carrier gas (e.g., argon), a halogen-containing gas (e.g., hydrogen fluoride, diatomic fluorine, and/or nitrogen trifluoride) and a hydrogen-containing gas (e.g., ammonia), are all activated by a remote plasma source. For example, the carrier gas, the halogen-containing gas and the hydrogen-containing gas may be combined prior to flowing the gases through the remote plasma source.

In some embodiments, formation of a pre-clean material can include first introducing into a reaction chamber a combination of a carrier gas (e.g., argon) and a halogen-containing gas (e.g., hydrogen fluoride, diatomic fluorine, and/or nitrogen trifluoride) activated by a remote plasma source, followed by a combination of unactivated halogen-containing gas (e.g., hydrogen fluoride) and hydrogen-containing gas (e.g., ammonia). In some embodiments, formation of a pre-clean material can include first introducing into a reaction chamber a combination of a carrier gas and a halogen-containing gas activated by a remote plasma source, then sequential flow of unactivated halogen-containing gas followed by unactivated hydrogen-containing gas.

In some embodiments, one or more processes can be used for gas removal from the reaction chamber (e.g., removal of an existing reaction chamber atmosphere, which may include excess reactant gas and/or gaseous reaction byproducts). In some embodiments, one or more gas removal processes can be used between flows of constituents of the reactant gas into the reaction chamber. For example, the reaction chamber may be evacuated and/or purged. Various inert gases may be used in the purge process, including for example nitrogen ($N_2$), helium (He), and/or argon (Ar). In some embodiments, unactivated inert gas can be used in the purge process (e.g., unactivated $N_2$, He, and/or Ar).

A sequence of gas flow in a pre-clean process can include, for example, first introducing into the reaction chamber a combination of a carrier gas (e.g., argon) and a halogen-containing gas (e.g., hydrogen fluoride, diatomic fluorine, and/or nitrogen trifluoride) activated by a remote plasma source, followed by a gas removal process, and then followed by flow into the reaction chamber of a combination of unactivated halogen-containing gas (e.g., hydrogen fluoride) and hydrogen-containing gas (e.g., ammonia).

In some embodiments, a gas removal process can be used prior to starting the flow of reactant gas and/or subsequent to stop of flow of reactant gas into the reaction chamber. In some embodiments, one or more purge processes can be performed prior to starting flow of reactant gas into the reaction chamber and/or subsequent to stopping flow of reactant gas into the reaction chamber. For example, one or more inert gases (e.g., argon, including unactivated argon) can be flowed into the reaction chamber prior to starting flow of reactant gas and, in some embodiments, subsequent to stopping the flow of the reactant gas into the reaction chamber. An example of a sequence of gas flow can include, for example, performing a first reaction chamber purge process including flowing into the reaction chamber one or more inert gases, then introducing constituents of the reactant gas into the reaction chamber. After stopping the flow of constituents of the reactant gas, a second purge process can be performed, where the second purge process includes flowing into the reaction chamber one or more inert gases for purging the reaction chamber of excess constituents of the reactant gas and/or gaseous reaction byproducts.

In some embodiments, one or more inert gases of a purge process can be flowed through the remote plasma unit prior to being introduced into the reaction chamber. The one or more inert gases of the purge process may not be plasma activated within the remote plasma unit (e.g., flow of the one or more inert gases through the remote plasma unit may occur while the plasma is not ignited within the remote plasma unit). For example, the one or more inert gases may be used to purge the remote plasma unit and/or for subsequently igniting the plasma in the remote plasma unit. For example, after flowing an inert gas through the remote plasma unit for a desired duration of time while the plasma is not ignited, flow of the inert gas through the remote plasma unit may be continued such that plasma within the remote plasma unit can be ignited with that inert gas flowing through the remote plasma unit.

In some embodiments, one or more constituents of the reactant gas can be maintained at a desired temperature when introduced into the reaction chamber. For example, one or more of the carrier gas, the halogen-containing gas, and the hydrogen-containing gas may be heated prior to being introduced into the reaction chamber for forming the pre-clean material. In some embodiments, the hydrogen-containing gas is heated. For example, the hydrogen-containing gas may be heated to a temperature of about 30° C. to about 120° C., including about 80° C. to about 115° C., about 70° C. to about 110° C., about 70° C. to about 105° C., and about 70° C. to about 100° C. Pre-heating may advantageously facilitate improved pre-clean process performance, for example facilitating formation of the pre-clean material. In some embodiments, a substrate surface pre-clean process can include a pre-heated ammonia gas, the ammonia gas being heated to a temperature of about 80° C. to about 115° C. One or more other constituents of the reactant gas may also be pre-heated.

It has been found that the ratio of the various reactant gases in the pre-clean process can impact selectivity in the removal of the silicon oxide material with respect to silicon nitride. In some embodiments, a reactant gas for a pre-clean process can have a molar ratio of a halogen-containing gas to a hydrogen-containing gas of about 3:1 to about 10:1. In some embodiments, the molar ratio can be about 4:1 to about 10:1, including about 5:1 to about 10:1. For example, the reactant gas for the pre-clean process can have a molar ratio of ammonia to nitrogen trifluoride, hydrogen fluoride and/or fluorine gas of about 4.5:1. In some embodiments, a molar ratio of ammonia activated by a remote plasma source to unactivated nitrogen trifluoride pre-heated in its transfer tube can be about 3:1. Advantageously, such ratios can provide high levels of selectivity for removing silicon oxide relative to silicon nitride.

Figure 2:
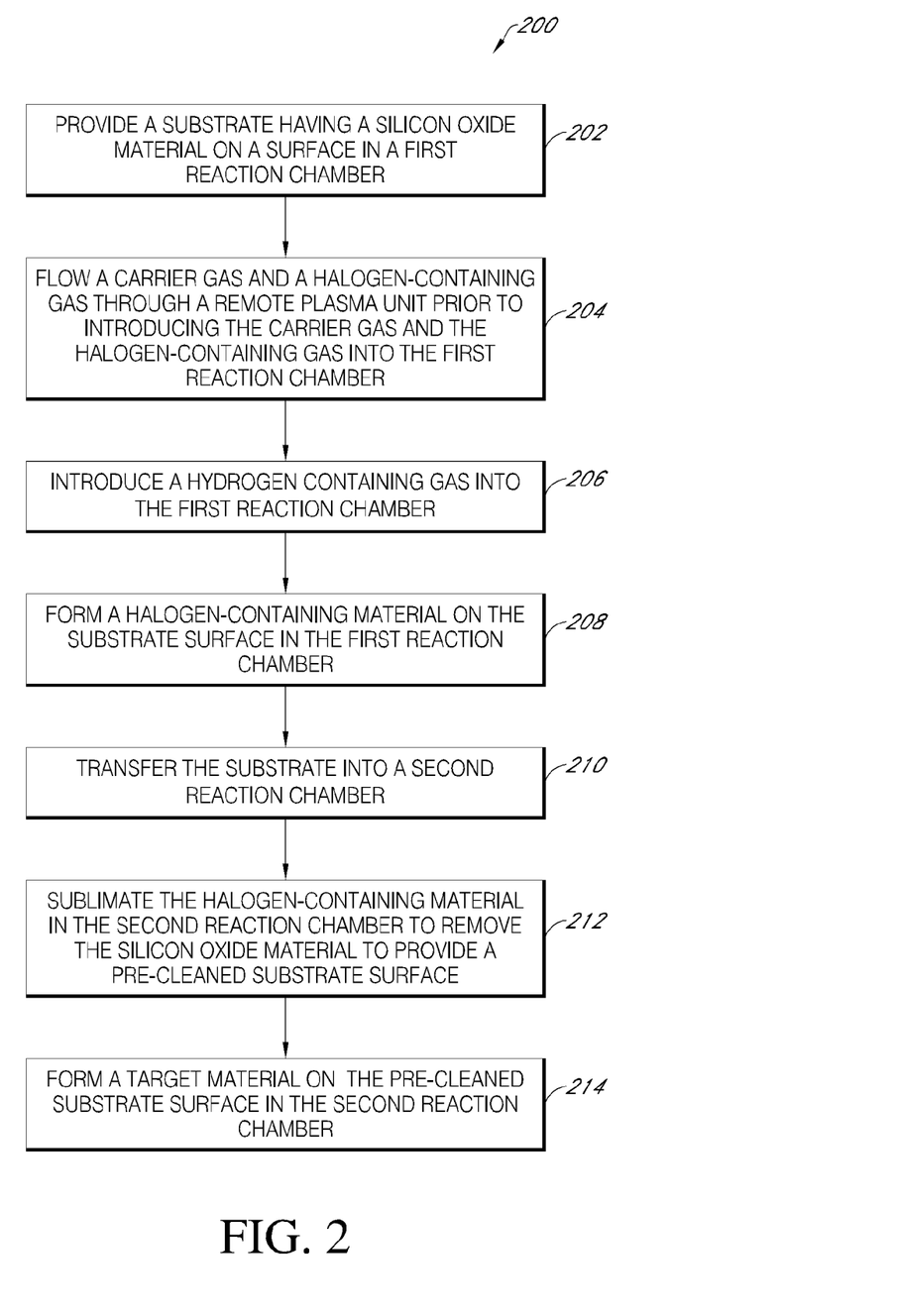
FIG. 2 shows another example of a process for pre-cleaning a substrate surface and for forming a target material on the substrate surface.

FIG. 2 shows an example of a process 200 for pre-cleaning a substrate surface. In block 202, a substrate having a silicon oxide material on a surface can be provided in a first reaction chamber. In block 204, a carrier gas and a halogen-containing gas can be introduced into the first reaction chamber, for example by flowing a carrier gas and a halogen-gas through a remote plasma source prior to introducing the gases into the first reaction chamber. The halogen-containing gas (e.g., a fluorine-containing gas, such as nitrogen trifluoride) and a carrier gas comprising argon can be activated by a remote plasma unit prior to being introduced into the first reaction chamber. In block, 206, a hydrogen-containing gas can be introduced into the first reaction chamber. The hydrogen-containing gas may or may not be activated by a remote plasma source. In some embodiments, the hydrogen-containing gas is pre-heated, such as by pre-heating at least a portion of a delivery channel (e.g., a transfer tube) for delivering the hydrogen-containing gas into the reaction chamber (e.g., heating a portion of the delivery channel proximate to the reaction chamber). For example, the reactant gas for the substrate pre-clean process can include a carrier gas and a halogen-containing gas activated by a remote plasma, and a pre-heated hydrogen-containing gas. In block 208, a pre-clean material comprising a halogen can be formed in the first reaction chamber due to the exposure of the substrate surface silicon oxide material to the reactant gas. In block 210, the substrate can be transferred to a second reaction chamber. In block 212, the pre-clean material comprising halogen can be sublimated in the second reaction chamber, facilitating removal of the substrate surface silicon oxide material and providing a pre-cleaned substrate surface. In block 214, a target material can be formed in the second reaction chamber on the pre-cleaned substrate surface, for example by formation of a conductive material using an epitaxial growth process.

An example sequence of a pre-clean process can include providing into a first reaction chamber a substrate having a surface to be cleaned. The substrate can be maintained at a temperature of about 15° C. to about 30° C. within the first reaction chamber. For example, the substrate can be maintained at a temperature of about 17° C. to about 29° C. A first purge process can be performed prior to starting flow of reactant gas into the first reaction chamber. For example, unactivated argon gas can be flowed into the first reaction chamber, after the substrate is provided within the first reaction chamber, and prior to starting flow of reactant gas. The unactivated argon gas may be flowed through the remote plasma unit prior to introducing the unactivated argon gas into the first reaction chamber. For example, the unactivated argon gas may be flowed through the remote plasma unit while no plasma is ignited in the remote plasma unit. Once desired purging of the first reaction chamber is completed, an unactivated hydrogen-containing gas (e.g., unactivated ammonia ($NH_3$)) may be introduced into the first reaction chamber. The unactivated hydrogen-containing gas can be not pre-heated prior to being introduced into the first reaction chamber (e.g., unactivated $NH_3$ introduced into the first reaction chamber can be not pre-heated). Subsequently, plasma within the remote plasma unit can be ignited with the argon gas flowing through that unit and into the first reaction chamber. A halogen-containing gas, such as nitrogen trifluoride ($NF_3$), can subsequently be activated by the remote plasma unit by flowing the halogen-containing gas through the remote plasma unit and into the reaction chamber. After a desired formation of a substrate surface pre-clean material, the flow of reactant gas may be stopped and the plasma in the remote plasma unit may be turned off. A second purge process can be performed after stopping flow of the reactant gas. For example, unactivated argon gas can be flowed into the reaction chamber in the second purge process. The unactivated argon gas may be flowed through the remote plasma unit during the second purge process prior to being introduced into the first reaction chamber. The substrate having the substrate surface pre-clean material formed thereon may be removed from the first reaction chamber and transferred to a second, different chamber in which the substrate surface pre-clean material may be removed. As described herein removal of the substrate surface pre-clean material may include sublimation of the substrate surface pre-clean material by heating the substrate surface pre-clean material to a temperature of greater than about 80° C. In some embodiments, a target material can be formed on the pre-cleaned substrate surface in the second reaction chamber, including formation of an epitaxial material layer. In some embodiments, a pre-clean process having such a sequence can advantageously facilitate achieving high selectivity (e.g., the selectivity of removal of substrate surface silicon oxide relative to another material on the substrate surface, such as silicon nitride material), including a selectivity of about 14:1. In some embodiments, a pre-clean process having such a sequence can advantageously facilitate achieving improved selectivity as described herein.

Figure 3:
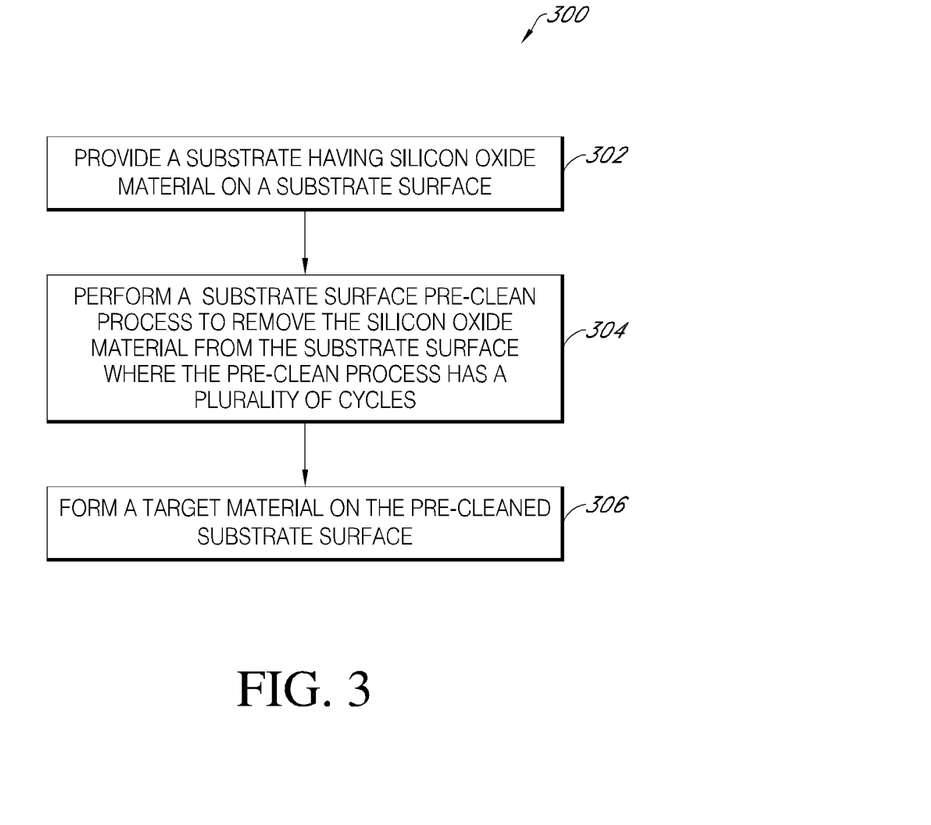
FIG. 3 shows yet another example of a process for pre-cleaning a substrate surface.

FIG. 3 shows another example of a substrate surface pre-clean process 300. In block 302, a substrate having silicon oxide material on a surface is provided. In block 304, a substrate surface pre-clean process for removing the substrate surface oxide material can be performed, where the pre-clean process includes a plurality of repeated cycles. In some embodiments, each cycle of the pre-clean process can include forming and removing a pre-clean material (e.g., forming and removing a halogen-containing material for removal of the substrate surface silicon oxide material). For example, a first cycle of a pre-clean process can include forming a first halogen-containing material on a substrate surface having a silicon oxide and sublimating the first halogen-containing material from the substrate surface to remove at least a portion of the substrate surface silicon oxide material. In some embodiments, a process for providing a pre-cleaned substrate surface can include performing two cycles of forming and removing halogen-containing material from the substrate surface. In block 306, a target material can be formed on the pre-cleaned substrate surface.

One or more of the plurality of cycles of the pre-clean process 300 can be performed according to one or more processes described herein. For example, a reactant gas (e.g., concentration of various constituents of the reactant gas, activation and/or pre-heating of one or more constituents of the reactant gas), and/or one or more process parameters (e.g., a substrate temperature during formation and/or sublimation of a pre-clean material) of a cycle can be selected as described herein. In some embodiments, a reactant gas and/or one or more process parameters of a cycle can be the same as or different from that of another cycle in the pre-clean process.

In some embodiments, one or more cycles, or a portion of a cycle, of the plurality of cycles of a substrate surface pre-clean process can be performed in a first reaction chamber. In some embodiments, one or more other cycles, or a portion of a cycle, of the plurality of cycles of can be performed in one or more different reaction chambers. For example, a substrate may be transferred from a first reaction chamber to a second reaction chamber after performing one or more cycles of the pre-clean process in the first reaction chamber, or after performing a portion of a cycle of the pre-clean process in the first reaction chamber, such that a final removal of a pre-clean material in a final cycle of the pre-clean process is performed in a reaction chamber other than the first reaction chamber. In some embodiments, all cycles of a pre-clean process can be performed in the same reaction chamber.

In some embodiments, formation of a target material (e.g., an epitaxial layer comprising mono-crystalline silicon) on a pre-cleaned substrate surface can be performed in the same reaction chamber in which removal of a final pre-clean material is performed. For example, a pre-clean cycle can include two cycles, including formation and removal of a first pre-clean material and formation and/removal of a second pre-clean material. In some embodiments, formation and removal of the first pre-clean material and/or the second pre-clean material can be performed in a same reaction chamber. In some embodiments, removal of the second pre-clean material can be performed in a reaction chamber different from the reaction chamber in which formation and/or removal of the first pre-clean material, and/or formation of the second pre-clean material, is performed. For example, formation and removal of the first pre-clean material, and formation of the second pre-clean material may be performed in a reaction chamber different from the chamber in which removal of the second pre-clean material is performed. In some embodiments, removal of the second pre-clean material can be performed in a second reaction chamber and a target material can be formed on the pre-cleaned substrate surface in the second reaction chamber (e.g., a silicon material deposited by an epitaxial deposition process).

Figure 4:
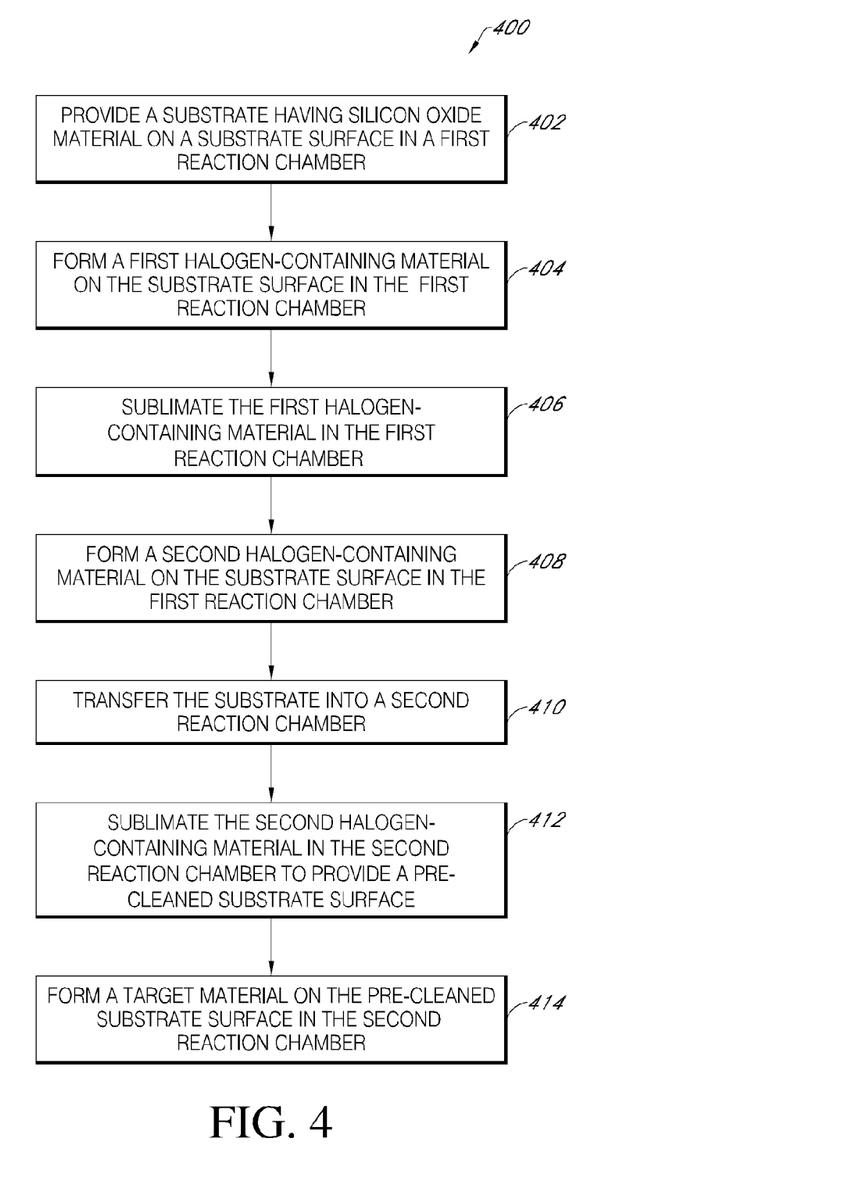
FIG. 4 shows an additional example of a process for pre-cleaning a substrate surface and for forming a target material on the substrate surface.

FIG. 4 shows an example of a substrate surface pre-clean process 400 in which the pre-clean process includes a plurality of cycles. In block 402, a substrate having silicon oxide on a surface can be provided in a first reaction chamber. In block 404, a first halogen-containing material can be formed on the substrate surface in the first reaction chamber. In block 406, the first halogen-containing material can be removed from the substrate surface, for example, by sublimating the first halogen-containing material in the first reaction chamber, to facilitate removal of at least a first portion of the silicon oxide from the substrate surface. In block 408, a second halogen-containing material can be formed on the substrate surface in the first reaction chamber. In block 410, the substrate can be transferred to a second reaction chamber. In block 412, the second halogen-containing material can be removed from the substrate surface, for example, by sublimating the second halogen-containing material in the second reaction chamber, to facilitate removal of at least a first portion of the silicon oxide from the substrate surface and provide a substrate having a pre-cleaned surface. In block 414, a target material can be formed on the pre-cleaned substrate surface in the second reaction chamber. For example, a mono-crystalline silicon material can be formed over the pre-cleaned substrate surface using an epitaxial deposition process. In some embodiments, a polycrystalline material can be formed (e.g., polysilicon). In some embodiments, blocks 406 and 408 can be repeated one or more times before proceeding to block 408.

It has been found that the selectivity (e.g., the selectivity of removal of substrate surface silicon oxide relative to another material on the substrate surface, such as silicon nitride material) of a first cycle of a pre-clean process can be significantly different from the selectivity of a subsequent cycle of the pre-clean process. In some embodiments, the subsequent cycle of the pre-clean process can advantageously demonstrate significantly higher selectivity compared to the first cycle of the pre-clean process. In some embodiments, a second cycle of a pre-clean process can demonstrate selective removal of the substrate surface silicon oxide material relative to a silicon nitride on the substrate surface at a selectivity of about 30:1 to about 150:1, about 60:1 to about 150:1, or about 60:1 to about 100:1. A pre-clean process including a larger number of cycles may facilitate even higher selectivity performance.

Figure 5:
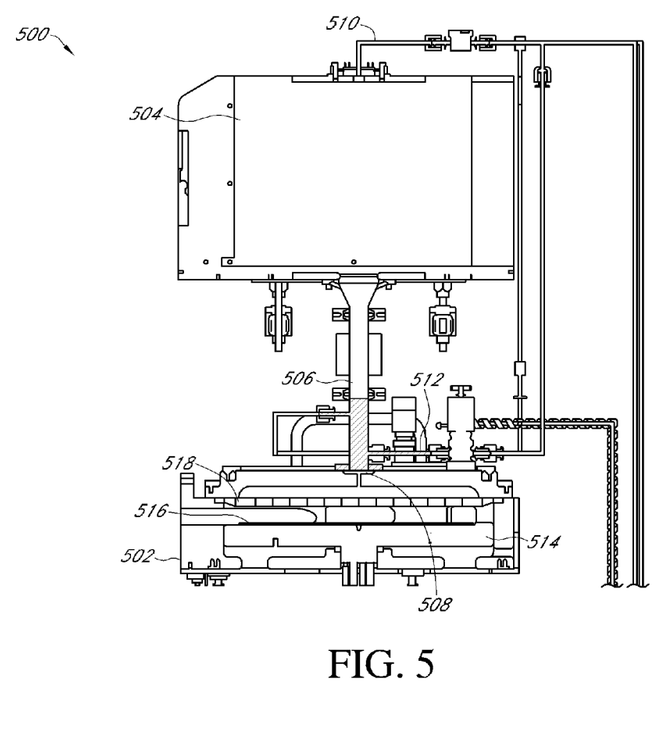
FIG. 5 shows an example of an apparatus configured to perform a substrate surface pre-cleaning process and/or for forming a target material on the substrate surface.

FIG. 5 shows an embodiment of an apparatus 500 which can be used for performing at least a portion of a substrate surface pre-clean process as described herein. The apparatus 500 may be configured for formation and/or removal of a pre-clean material, including formation and/or removal of a pre-clean material to facilitate removal of a silicon oxide material from the substrate surface. The apparatus 500 may include a reaction chamber 502 in fluid communication with a remote plasma unit 504, for example through a transfer tube 506. In some embodiments, the transfer tube 506 can be configured to deliver a reactant gas into the reaction chamber 502 (e.g., a reactant gas comprising ammonia gas, fluorine-containing gas, and/or a carrier gas). For example, the transfer tube 506 may introduce reactant gas into the reaction chamber 502 via a reaction chamber gas inlet 508 located at a distal portion of the transfer tube 506. In some embodiments, the remote plasma unit 504 may include a gas inlet 510 configured to allow flow of constituents of the reactant gas through the remote plasma unit 504 such that the constituents of the reactant gas can be activated by the plasma unit 504.

In some embodiments, the transfer tube 506 can include a transfer tube gas inlet 512 configured to allow introduction into the reaction chamber 502 of one or more constituents of the reactant gas which is not activated by the remote plasma unit 504. As shown in FIG. 5, the transfer tube gas inlet 512 may be located proximate to the reaction chamber gas inlet 508. In some embodiments, the transfer tube gas inlet 512 may be positioned at another location on the transfer tube 506. In some embodiments, at least a portion of the transfer tube 506 can be maintained at a desired temperature. For example, a portion of the transfer tube 506 may be heated (e.g., to a temperature of about 80° C. to about 115° C.), including the portion of the transfer tube 506 adjacent to and/or surrounding the portion between the transfer tube gas inlet 512 and the reaction chamber gas inlet 508. For example, at least the portion of the transfer tube 506 between the transfer tube inlet 512 and the reaction chamber gas inlet 508 may be heated to a desired temperature. In some embodiments, the entire length or substantially the entire length of the transfer tube 506 is maintained at a desired temperature (e.g., heated to a temperature of about 30° C. to about 120° C.). A temperature to which the transfer tube 506 is heated can be selected based on a variety of factors. In some embodiments, at least a portion of the transfer tube 506 can be maintained at a desired temperature by using a heater jacket (e.g., covering at least a portion of an exterior surface of the transfer tube 506 with a heater jacket) and/or a material coating (e.g., coating at least a portion of an exterior surface of the transfer tube 506 with the material coating, such as a material coating comprising alumina, including pyrolytic alumina). In some embodiments, a temperature of the transfer tube 506 can be monitored using one or more thermocouples placed at one or more locations along the transfer tube 506. Temperature along a heated portion of the transfer tube 506 may or may not be uniform. In some embodiments, a temperature along the heated portion of the transfer tube 506 can be maintained at one or substantially one desired temperature. In some embodiments, a temperature of one heated portion of the transfer tube 506 may be significantly different from that of another heated portion of the transfer tube 506.

In some embodiments, the reaction chamber 502 can include a susceptor 514 for receiving a substrate 516 (e.g., a wafer). In some embodiments, the reaction chamber 502 can include a showerhead 518 (e.g., a gas distribution plate) positioned downstream of a reactant gas inlet of the reaction chamber 502. The shower head 518 may be configured to facilitate improved uniformity in the distribution of gas species over the substrate 516 positioned in the reaction chamber 502. The substrate 516 may be raised from and/or lowered back onto the susceptor 514 such that the substrate 516 can be positioned at one or more elevated positions (e.g., relative to a position at which the substrate 516 is received by the susceptor 514). For example, the showerhead 512 can be positioned over and opposite the susceptor 514 such that the substrate 516 to can be raised from susceptor 514 to provide a desired separation distance between the substrate 516 and the showerhead 518.

In some embodiments, a carrier gas (e.g., argon), and a fluorine-containing gas (e.g., nitrogen trifluoride), from carrier gas and fluorine-containing gas sources, respectively (not shown), can be introduced into the remote plasma unit 504 via the remote plasma unit gas inlet 510 for activation by the remote plasma unit 504. The carrier gas and the fluorine-containing gas activated by the remote plasma unit 504 can flow through the remote plasma unit 504 and to the reaction chamber 502 through the transfer tube 506. In some embodiments, one or more constituents of the reactant gas not activated by the remote plasma unit 504, including for example, a hydrogen-containing gas such as ammonia from an ammonia source (not shown), can be introduced downstream of the remote plasma unit 504 at a position along the transfer tube 506 via a transfer tube gas inlet 512. Portions of the transfer tube proximate to the transfer tube gas inlet 512 and/or the transfer tube gas inlet 512 itself may be heated such that one or more of the unactivated constituents of the reactant gas, such as unactivated ammonia, can be delivered into the reaction chamber 502 at a desired temperature.

In some embodiments, the substrate surface can be exposed to the activated reactant species and the unactivated reactant species simultaneously or substantially simultaneously, for example combining the activated reactant species and the unactivated reactant species prior to delivery into the reaction chamber, such as prior to delivery through the reaction chamber gas inlet 508. In some embodiments, the substrate surface can be sequentially exposed to the activated reactant species and/or the unactivated reactant species. For example, the substrate surface may be first exposed to activated reactant species (e.g., activated by a remote plasma unit) of one or more constituents of the reactant gas, followed by exposure to a second activated or unactivated reactant species (e.g., unactivated by a remote plasma unit) of another of the one or more constituents of the reactant gas. In some embodiments, the substrate surface can be first exposed to unactivated reactant species followed by exposure to activated reactant species. The sequence of exposure can be selected to provide desired pre-clean process performance. For example, a substrate surface can be first exposed to carrier gas and fluorine-containing gas activated by a remote plasma unit, followed by exposure to a combination of unactivated hydrogen-containing gas (e.g., ammonia) and fluorine-containing gas, or by exposure first to unactivated hydrogen-containing gas and then to unactivated fluorine-containing gas.

Reactant species can be distributed over the substrate 516 maintained on the susceptor 514 by flowing the reactant species through the showerhead 518. In some embodiments, the substrate 516 can be raised from the susceptor 514 to a desired position during at least a portion of the pre-clean process. In some embodiments, the substrate 516 may be at an elevated position during at least a portion of a pre-clean material formation process and/or at least a portion of a pre-clean material removal process (e.g., during a process for sublimating the pre-clean material).

The reaction chamber 502 may or may not be part of a multi-chamber processing system, such that a substrate processed by reaction chamber 502 may be transferred to a second reaction chamber without or substantially without being exposed to ambient air. For example, the reaction chamber 502 may be a part of a cluster tool system.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or subcombinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

What is claimed is:

1. A method for integrated circuit fabrication, the method comprising:
   removing a silicon oxide material from a surface of a substrate, wherein removing the silicon oxide material comprises:
      depositing a halogen-containing material on the surface of the substrate in a first reaction chamber;
      transferring the substrate having the halogen-containing material to a second reaction chamber; and
      sublimating the halogen-containing material in the second reaction chamber, wherein sublimating the halogen-containing material comprises exposing the halogen-containing material to a plasma generated by a remote plasma unit; and
   subsequently depositing a conductive material on the surface of the substrate in the second reaction chamber.

2. The method of claim 1, wherein sublimating the halogen-containing material comprises heating the surface of the substrate to a temperature of about 80° C. or greater.

3. The method of claim 1, wherein depositing the halogen-containing material comprises introducing into the first reaction chamber:
   a carrier gas activated by the remote plasma unit; and
   a halogen-containing gas.

4. The method of claim 3, wherein the carrier gas comprises an inert gas.

5. The method of claim 4, wherein the inert gas comprises argon.

6. The method of claim 3, further comprising activating the halogen-containing gas by flowing the halogen-containing gas through the remote plasma unit.

7. The method of claim 6, wherein depositing the halogen-containing material further comprises subsequently introducing into the first reaction chamber a halogen-containing gas unactivated by a plasma unit and a hydrogen-containing gas unactivated by a plasma unit.

8. The method of claim 7, further comprising removing the activated halogen-containing gas from the first reaction chamber prior to introducing into the first reaction chamber the unactivated halogen-containing gas and the unactivated hydrogen-containing gas.

9. The method of claim 6, wherein depositing the halogen-containing material further comprises subsequently introducing into the first reaction chamber a halogen-containing gas unactivated by a plasma unit followed by a hydrogen-containing gas unactivated by a plasma unit.

10. The method of claim 9, further comprising removing the activated halogen-containing gas from the first reaction chamber prior to introducing into the first reaction chamber the unactivated halogen-containing gas, and removing the unactivated halogen-containing gas from the first reaction chamber prior to introducing the unactivated hydrogen-containing gas.

11. The method of claim 3, wherein the halogen-containing gas comprises a fluorine-containing gas.

12. The method of claim 11, wherein the fluorine-containing gas comprises nitrogen trifluoride.

13. The method of claim 11, wherein the fluorine-containing gas comprises at least one of hydrogen fluoride and diatomic fluorine.

14. The method of claim 3, wherein depositing the halogen-containing material further comprises introducing a hydrogen-containing gas into the first reaction chamber.

15. The method of claim 14, further comprising activating at least one of the hydrogen-containing gas and the halogen-containing gas by flowing at least one of the hydrogen-containing gas and the halogen-containing gas through the remote plasma unit.

16. The method of claim 14, wherein the hydrogen-containing gas comprises ammonia.

17. The method of claim 14, wherein introducing the hydrogen-containing gas into the first reaction chamber comprises:
flowing the hydrogen-containing gas through a transfer tube between a remote plasma unit and the first reaction chamber; and
heating at least a portion of the transfer tube to a temperature of about 30° C. to about 120° C.

18. The method of claim 17, further comprising introducing into the first reaction chamber the hydrogen-containing gas and the halogen-containing gas at a molar ratio of about 3:1 to about 10:1.

19. The method of claim 1, wherein the halogen-containing material comprises ammonium hexafluorosilicate ($(NH_4)_2SiF_6$).

20. The method of claim 1, wherein sublimating the halogen-containing material comprises exposing the halogen-containing material to a heated gas, wherein the heated gas is heated to a temperature of greater than about 150° C.

21. The method of claim 1, further comprising maintaining the substrate at a temperature of about 21° C. to about 28° C. during depositing the halogen-containing material.

22. The method of claim 1, wherein the second reaction chamber comprises an epitaxial deposition chamber and wherein depositing the conductive material comprises performing an epitaxial deposition of silicon.

23. A method for integrated circuit fabrication, the method comprising:
removing a silicon oxide material from a surface of a substrate, wherein removing the silicon oxide material comprises:
depositing a halogen-containing material on the surface of the substrate in a first reaction chamber;
transferrin the substrate having the halogen-containing material to a second reaction chamber; and
sublimating the halogen-containing material in the second reaction chamber, wherein sublimating the halogen-containing material comprises heating the surface of the substrate to a temperature of about 80° C. to about 100° C.; and
subsequently depositing a conductive material on the surface of the substrate in the second reaction chamber.

24. A method for integrated circuit fabrication, the method comprising:
removing a silicon oxide material from a surface of a substrate, wherein removing the silicon oxide material comprises:
depositing a halogen-containing material on the surface of the substrate in a first reaction chamber;
transferrin the substrate having the halogen-containing material to a second reaction chamber; and
sublimating the halogen-containing material in the second reaction chamber,
wherein the surface of the substrate further comprises silicon nitride, and wherein removing the silicon oxide material comprises selectively removing the silicon oxide material relative to the silicon nitride at a selectivity of about 7:1 to about 60:1; and
subsequently depositing a conductive material on the surface of the substrate in the second reaction chamber.

25. A method for integrated circuit fabrication, the method comprising:
removing a silicon oxide material from a surface of a substrate, wherein removing the silicon oxide material comprises:
depositing a halogen-containing material on the surface of the substrate in a first reaction chamber;
transferring the substrate having the halogen-containing material to a second reaction chamber; and
sublimating the halogen-containing material in the second reaction chamber, wherein sublimating the halogen-containing material comprises exposing the halogen-containing material to ultra-violet radiation; and
subsequently depositing a conductive material on the surface of the substrate in the second reaction chamber.

26. A method for integrated circuit fabrication, the method comprising:
removing a silicon oxide material from a surface of a substrate, wherein removing the silicon oxide material comprises:
depositing a first halogen-containing material on the surface of the substrate in a first reaction chamber;
sublimating the first halogen-containing material in the first reaction chamber to remove a first portion of the silicon oxide material;
depositing a second halogen-containing material on the surface of the substrate in the first reaction chamber to remove a second portion of the silicon oxide material; and
sublimating the second halogen-containing material,
wherein the surface of the substrate further comprises silicon nitride, and wherein removing the first portion of the silicon oxide material comprises selectively removing the first portion of the silicon oxide material relative to the silicon nitride with a selectivity of about 7:1 to about 20:1.

27. The method of claim 26, further comprising transferring the substrate having the second halogen-containing material into a second reaction chamber.

28. The method of claim 27, further comprising sublimating the second halogen-containing material in the second reaction chamber.

29. The method of claim 27, further comprising depositing a conductive material on the surface of the substrate in the second reaction chamber.

30. The method of claim 29, wherein depositing the conductive material comprises performing an epitaxial deposition of silicon.

31. The method of claim 26, wherein sublimating the second halogen-containing material comprises selectively removing the second portion of the silicon oxide material relative to the silicon nitride with a selectivity of about 10:1 to about 100:1.

32. The method of claim 31, wherein sublimating the second halogen-containing material comprises selectively removing the second portion of the silicon oxide material relative to the silicon nitride with a selectivity of about 40:1 to about 100:1.

33. The method of claim 26, wherein at least one of depositing the first halogen-containing material and depositing the second halogen-containing material comprises introducing a carrier gas into the first reaction chamber.

34. The method of claim 33, further comprising activating the carrier gas by flowing the carrier gas through a remote plasma unit.

35. The method of claim 34, wherein depositing the first halogen-containing material and depositing the second halogen-containing material comprises introducing into the first reaction chamber a halogen-containing gas and a hydrogen-containing gas.

36. The method of claim 35, further comprising activating at least one of the halogen-containing gas and the hydrogen-containing gas by flowing at least one of the halogen-containing gas and the hydrogen-containing gas through the remote plasma unit.

37. The method of claim 36, wherein the halogen-containing gas comprises at least one of nitrogen trifluoride, hydrogen fluoride, and diatomic fluorine, wherein the hydrogen-containing gas comprises ammonia, and wherein the carrier gas comprises argon.

38. The method of claim 37, wherein at least one of the first halogen-containing material and the second halogen-containing material comprises ammonium hexafluorosilicate $((NH_4)_2SiF_6)$.

39. The method of claim 26, wherein the first halogen-containing material and the second halogen-containing material comprise a same material.

\* \* \* \* \*